United States Patent [19]
Hamada et al.

[11] 4,083,019
[45] Apr. 4, 1978

[54] CURRENT CONTROLLED EMITTER COUPLED MULTIVIBRATOR

[75] Inventors: Takeshi Hamada; Yoshio Ishigaki, both of Tokyo; Masayuki Hongu, Komae, all of Japan

[73] Assignee: Sony Corporation, Tokyo, Japan

[21] Appl. No.: 546,757

[22] Filed: Dec. 1, 1976

Related U.S. Application Data

[63] Continuation-in-part of Ser. No. 542,719, Jan. 21, 1975, abandoned.

[30] Foreign Application Priority Data

Jan. 29, 1974 Japan .................................. 49-12393

[51] Int. Cl.² .................. H03K 3/282; H03K 7/06
[52] U.S. Cl. ................................. 331/113 R; 329/102; 332/9 T; 332/14; 332/16 T
[58] Field of Search .................. 331/113 R; 332/9 T, 332/14, 16 T; 329/101–103; 325/38 R, 141–143

[56] References Cited

U.S. PATENT DOCUMENTS

| | | | |
|---|---|---|---|
| 3,811,097 | 5/1974 | Dijkmans | 331/113 R X |
| 3,857,110 | 12/1974 | Grebene | 331/113 R X |
| 3,902,140 | 8/1975 | Grebene | 332/14 X |

*Primary Examiner*—Siegfried H. Grimm
*Attorney, Agent, or Firm*—Lewis H. Eslinger; Alvin Sinderbrand

[57] ABSTRACT

A multivibrator circuit has a main constant current source through which the main portion of the current of the multivibrator circuit is supplied and a by-pass current source through which a portion of the current to be supplied to the main constant current source is supplied, whereby the duty cycle of the multivibrator circuit is controlled. When the by-pass current is changed, the frequency of the multivibrator circuit is changed. The frequency of the multivibrator, when used as the frequency-modulated oscillator in a video tape recorder, may thus be set regardless of the signal clipping level and signal clamping level in a video recording circuit of the video tape recorder.

14 Claims, 13 Drawing Figures

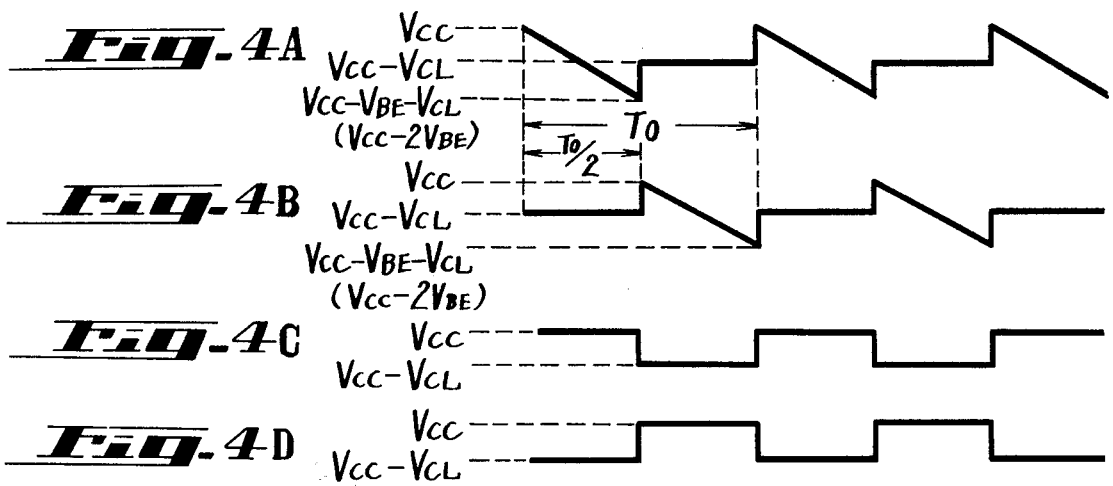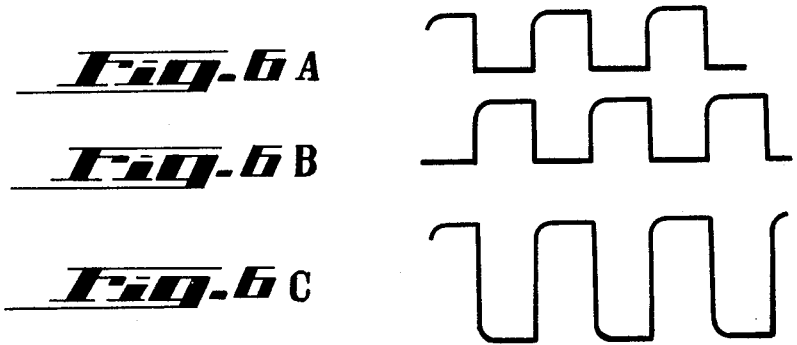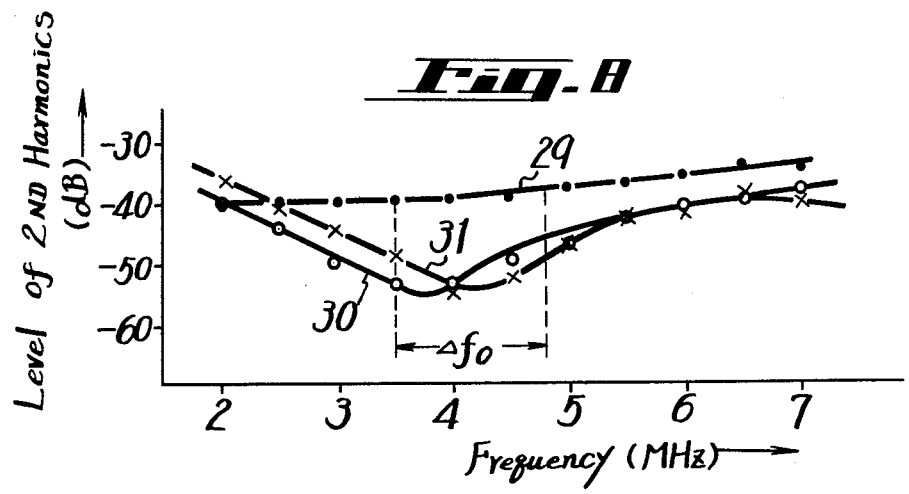

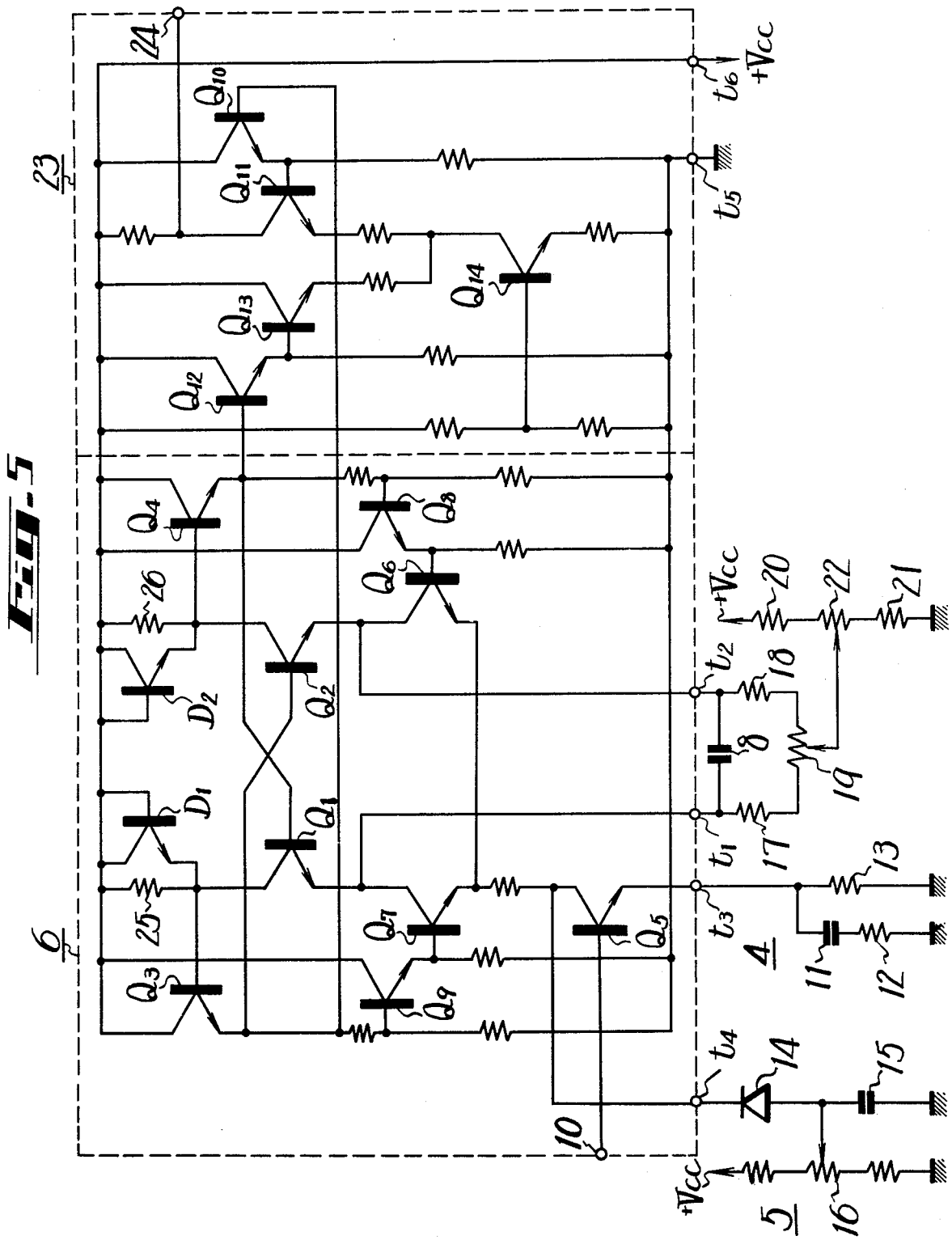

CURRENT CONTROLLED EMITTER COUPLED MULTIVIBRATOR

REFERENCE TO RELATED APPLICATIONS

This application is a continuation-in-part of the co-pending U.S. patent application Ser. No. 542,719, filed Jan. 21, 1975, and now abandoned.

BACKGROUND OF THE INVENTION

1. Field of the Invention

This invention relates generally to astable multivibrator circuits of the type useful as an angle modulator or demodulator, and more particularly to an astable multivibrator circuit in which the duty cycle and the duty ratio thereof are controlled.

2. Description of the Prior Art

In the prior art, an emitter-coupled astable multivibrator including transistors is employed as an oscillatory element which is useful as an angle modulator or angle demodulator, for example, a frequency modulator or a frequency demodulator.

In the emitter-coupled multivibrator, a capacitor is connected between the emitter electrodes of two transistors, and the base electrodes of the two transistors are connected to the collector electrodes thereof through emitter follower circuits, respectively. In operation, the two transistors conduct alternately to generate the oscillations of the circuit. The frequency of the circuit is determined by the time of the charging and discharging of the capacitor, and the oscillations may be frequency-modulated by varying the charging or discharging time of the capacitor as a function of an input voltage. The emitter electrodes of the two transistors are normally connected to a common constant current source. Although the current is independent of variations in voltage across the capacitor and is constant in that sense, the magnitude of this current is variable in accordance with an input signal. In this manner, the charging current of the capacitor can be varied in accordance with the input signal. As a result of this control of charging current during one state of conduction of the multivibrator, the duration of one complete cycle is variable and therefore the frequency of the multivibrator is variable.

When a modulating signal, a video signal, for example, is applied to the base electrodes of transistors used as the constant current source, the current through the constant current source is varied, and therefore a frequency-modulated multivibrator signal is produced.

In the video recording circuit of a video tape recorder (VTR), a signal clamping circuit clamps the synchronizing peaks or the black level of the video signal, and the clamped signal is then passed through a pre-emphasis circuit and a white level clipping circuit to the frequency modulator. When the video signal is applied to the frequency modulator, the synchronizing, or sync, signal clipping level of the video signal is set to correspond to a predetermined frequency $f_o$ of the frequency-modulated multivibrator. This frequency, referred to as the carrier frequency, is set, or controlled, by changing the clamping voltage level in the signal clamping circuit. However, the white clipping level in the white level clipping circuit is undesirably changed or influenced due to changes in the clamping level in the signal clamping circuit, and consequently the white clipping level must be re-adjusted. It may take much time and require great skill to adjust these levels in the level clamping and the white level clipping circuits alternately to achieve satisfactory operation.

SUMMARY OF THE INVENTION

According to the invention there is provided a multivibrator circuit free from the defects inherent in the prior art. The multivibrator circuit of the invention includes a pair of transistors the emitter electrodes of which are coupled through a capacitor connected in series between the emitters. As is customary in multivibrators, the base electrode of one transistor is connected to the collector electrode of the other transistor, and the collector electrode of the former is connected to the base electrode of the latter. Angle modulation is provided by connecting the emitters of the transistors in series with a common main current source which is controlled by a modulating video signal, and both ends of the capacitor are connected to a carrier-setting current source which may produce currents other than the main current from the main current source. The carrier-setting current from the carrier-setting current source is used to control the frequency of the astable multivibrator. Thus, the carrier setting of a frequency modulator, the reference frequency $f_o$ of which is the sync clipping level of the horizontal sync signal in a video signal, is achieved without shifting the clamping level of a level clamping circuit and the white clipping level of a white level clipping circuit.

In accordance with the invention, a variable resistor may be provided between lead terminals of the capacitor for emitter-coupling, so that the number of lead terminals is not increased. Hence, the invention is suitable for being produced as an integrated circuit.

An object of the invention is to eliminate the disadvantage of known frequency modulated multivibrator circuits and to provide a new and improved astable multivibrator circuit having a frequency control and setting circuit.

Still another object of the invention is to provide an astable multivibrator circuit which is useful as an angle modulator or demodulator and especially as a frequency modulator.

A still further object of the invention is to provide a frequency modulator for use in the video recording circuit of a VTR.

The other objects, features and advantages of the invention will become apparent from the following description taken in conjunction with the accompanying drawings.

BRIEF DESCRIPTION OF THE DRAWINGS

FIGS. 4A to 4D, inclusive, are waveform diagrams used for explaining the operation of the astable multivibrator circuit shown in FIG. 3.

FIG. 5 is a schematic circuit diagram showing an embodiment of the invention.

FIG. 6A, 6B and 6C are waveform diagrams used for explaining the embodiment shown in FIG. 5.

FIG. 8 is a graph showing the characteristics of a well known multivibrator and those shown in FIGS. 5 and 7.

DESCRIPTION OF THE PREFERRED EMBODIMENTS

Figure 1:
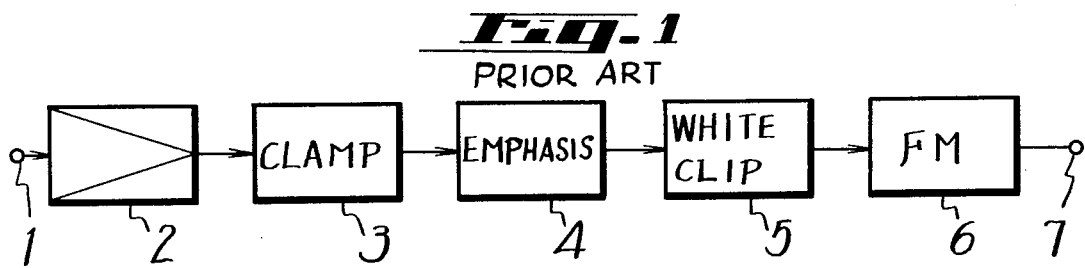
FIG. 1 is a block diagram showing a well known video signal recording circuit system.

In general, in a prior art video signal recording circuit, as shown in FIG. 1, an input video signal applied to an input terminal 1 passes through an amplifier 2, a level clamping circuit 3, a pre-emphasis circuit 4 and a white level clipping circuit 5 to a frequency modulator 6 in which the frequency of an oscillator is varied. The output signal, frequency-modulated by the video signal, is delivered to an output terminal 7. From there it is typically amplified and then applied to a rotary magnetic head to be recorded on a magnetic tape, all of which are not shown in the drawings because they are well known and are not part of this invention. The pre-emphasis circuit 4 serves to emphasize the high frequency of the input video signal for preventing the signal-to-noise ratio thereof from being deteriorated, especially in the high-frequency part of the video signal band. The input video signal is so frequency-modulated that the clipped peak of the horizontal sync signal in the video signal has a frequency $f_o$ of, for example, 3.5 MHz, and the white peak (maximum amplitude) of the video signal modulates the frequency of the oscillator to a value $f_1$ of, for example, 4.8MHz. As a result, the sync signal of the video signal applied to the frequency modulator 6 is set at a constant value at its clipped level by the level clamping circuit 3. When the video signal is passed through the pre-emphasis circuit 4, sharp overshoots are produced at the portions of the positive-going pulse and negative-going pulse in the video signal with the result that over modulations are apt to be achieved at these portions. To avoid this defect, the white level clipping circuit 5 is provided to clip the overshoot when it exceeds the white clipping level.

In the present invention an emitter-coupled astable multivibrator, which may be produced as an integrated circuit and which has a good linear relationship between the amplitude of the modulating voltage and the change of oscillation frequency, is used as the frequency-modulated oscillator in the circuit 6. Its oscillation frequency can be changed arbitrarily to achieve the desired carrier setting.

Figure 3:
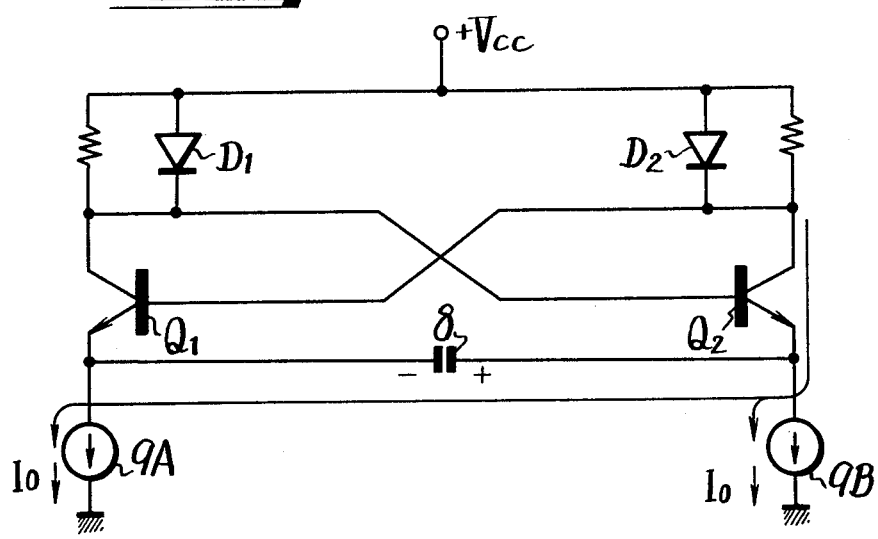
FIG. 3 is a basic schematic circuit diagram for an astable multivibrator circuit of an emitter coupled type according to this invention.

The emitter-coupled astable multivibrator includes a pair of transistors $Q_1$ and $Q_2$, as shown in the basic circuit in FIG. 3. In this embodiment, the base electrode of each transistor is connected to the collector electrode of the other transistor. The collector electrodes of both the transistors $Q_1$ and $Q_2$ are connected to a power supply terminal, which is supplied with a voltage of $+V_{CC}$, through parallel circuits of resistors and diodes $D_1$ and $D_2$, which are forward-biased with respect to the collector currents of the respective transistors. A capacitor 8 is connected in series between emitter electrodes of the transistors $Q_1$ and $Q_2$ and the emitters are also connected to respective constant current sources 9A and 9B. The constant current sources 9A and 9B produce equal currents $I_0$, which flow in the direction shown by arrows in FIG. 3.

When the transistor $Q_2$ becomes conductive, the other transistor $Q_1$ becomes non-conductive, and a capacitor charging current flows in the direction shown by arrow in FIG. 3. At this time, the diode $D_2$ conducts most of the collector current of the transistor $Q_2$, and if it is assumed that the voltages across the base-emitter electrodes of the transistors $Q_1$ and $Q_2$ are each $V_{BE}$ and the forward voltages of the diodes $D_1$ and $D_2$ are each $V_{CL}$, the emitter voltage of the transistor $Q_2$ is clamped at $(V_{CC} - V_{CL})$ as shown in FIG. 4B. At the same time the emitter voltage of the transistor $Q_1$, which was at the voltage $V_{CC}$, decreases linearly with time as shown in FIG. 4A as the capacitor 8 is charged. Further, since the transistor $Q_1$ is non-conductive, its collector voltage is $V_{CC}$ as shown in FIG. 4C, and the collector voltage of the transistor $Q_2$ is $(V_{CC} - V_{CL})$ as shown in FIG. 4D. The collector voltage of the transistor $Q_2$ is the same as the base voltage of the transistor $Q_1$. Accordingly, after the passage of a time $T_o/2$ from the time when the transistor $Q_1$ is made non-conductive and the transistor $Q_2$ is made conductive, the emitter voltage of the transistor $Q_1$ reaches the value $(V_{CC} - V_{BE} - V_{CL}) \approx (V_{CC} - 2V_{BE})$ (where $V_{BE} \approx V_{CL}$). When that happens, the transistor $Q_1$ is made conductive, and the transistor $Q_2$ becomes non-conductive. As a result, both the emitter voltage and the collector voltage of the transistor $Q_1$ are at a value $(V_{CC} - V_{CL})$ as shown in FIGS. 4A and 4C. At the same time the emitter voltage of the transistor $Q_2$ becomes equal to $V_{CC}$, as shown in FIG. 4B. During the time interval that the transistor $Q_2$ is non-conductive, its collector voltage is $V_{CC}$ as shown in FIG. 4D. Thus, the charging current $I_0$ flows into the capacitor 8 in the direction reverse to the direction of the arrow in FIG. 3, with the result that the emitter voltage of the transistor $Q_2$ is reduced at a linear rate. After a second time interval of $T_o/2$, the emitter voltage of the transistor $Q_2$ reaches the value $(V_{CC} - V_{CL} - V_{BE}) \approx (V_{CC} - 2V_{BE})$, and the transistor $Q_2$ again becomes conductive and the transistor $Q_1$ becomes non-conductive. The two time intervals $T_o/2$ are each equal to ½ of a period $T_o$ of the multivibrator.

With the circuit shown in FIG. 3, the above-mentioned operation will be repeated to produce a series of output pulses with opposite polarities at the collector electrodes of the transistors $Q_1$ and $Q_2$, respectively.

The period $T_o$ of the astable multivibrator circuit shown in FIG. 3 can be expressed by the following formula (1) since if the capacity of the capacitor 8 is taken as $C_0$, the time interval necessary for charging the capacitor 8 with the constant current $I_0$ and obtaining the voltage difference of $2V_{BE}$ is to $T_o/2$.

$$T_o = 4V_{BE}C_0/I_0 \quad (1)$$

The oscillation frequency $f_o$ of the astable multivibrator circuit is inversely proportional to the time $T_o$ and is expressed as follows:

$$f_o = I_0/4V_{BE}C_0 \quad (2)$$

Figure 2:
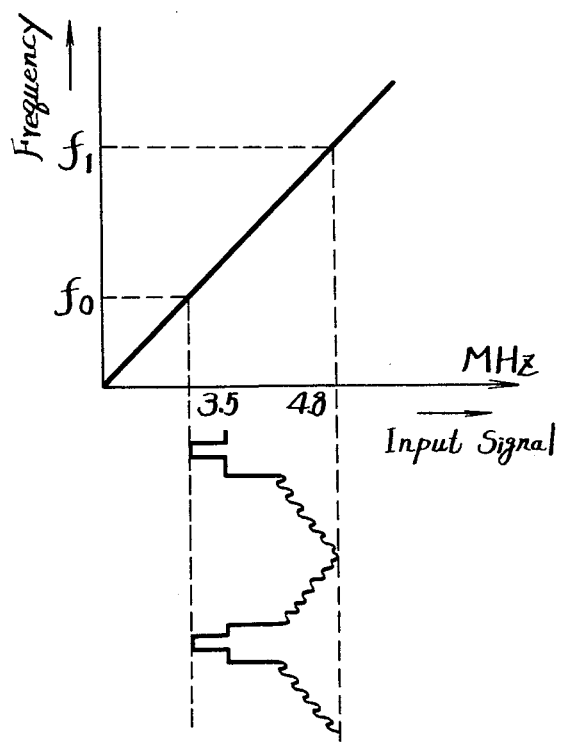
FIG. 2 is a graph showing the modulation characteristics of a frequency modulator.

As may be apparent from the formula (2), if the values of the constant currents $I_0$ from the constant current sources 9A and 9B vary with the video signals as the modulating signals, the oscillation frequency can be changed in response to the video signal, as shown in FIG. 2, to carry out the desired frequency modulation of the square wave signal generated by the multivibrator.

FIG. 5 is a schematic diagram showing an embodiment of the invention in which the above-mentioned emitter-coupled astable multivibrator circuit is employed as the frequency modulator 6 and in which the part surrounded by a dotted line is an integrated circuit. In the illustrated embodiment a transistor $Q_3$ is connected between the collector electrode of the transistor $Q_1$ and the base electrode of the transistor $Q_2$, and a transistor $Q_4$ is similarly connected between the collector electrode of the transistor $Q_2$ and the base electrode of the transistor $Q_1$. The transistors $Q_3$ and $Q_4$ prevent the switching characteristic of the circuit from being adversely affected due to the fact that the operating characteristics of the transistors $Q_1$ and $Q_2$ are saturated.

The capacitor 8 is connected between terminals $t_1$ and $t_2$ of the integrated circuit as an external component. The video signal applied by way of the input terminal 10 to the base electrode of a common main current source transistor $Q_5$ has already passed through a clamping circuit such as the circuit 3 in FIG. 1. The emitter electrode of the transistor $Q_5$ is connected to another terminal $t_3$ of the integrated circuit, and the pre-emphasis circuit 4 comprising a parallel circuit consisting of a resistor 13 and a series connection of a capacitor 11 and a resistor 12 is connected to the terminal $t_3$. The collector current of the transistor $Q_5$ serves as a source of the modulating current, and the collector electrode of the transistor $Q_5$ is connected by way of a terminal $t_4$ to the white level clipping circuit 5 that comprises a diode 14 and a capacitor 15 connected in series between the terminal $t_4$ and ground and also includes a potentiometer 16 to control the clipping level. Terminals $t_5$ and $t_6$ are connected to ground and the power supply, respectively.

The collector of the transistor $Q_5$ is also connected through a resistor to the connection point between the emitter electrodes of the transistors $Q_6$ and $Q_7$ which are made conductive. The collector electrode of the transistor $Q_7$ is connected to the emitter electrode of the transistor $Q_1$, and the collector electrode of the transistor $Q_6$ is connected to the emitter electrode of the transistor $Q_2$. The base electrode of the transistor $Q_6$ is connected through the emitter-base junctions of transistors $Q_8$ and $Q_4$ to the collector electrode of the transistor $Q_2$, while the base electrode of the transistor $Q_7$ is connected through the emitter-base junctions of transistors $Q_9$ and $Q_3$ to the collector electrode of the transistor $Q_1$.

With the circuit shown in FIG. 5, when the transistor $Q_1$ is non-conductive and the transistor $Q_2$ is conductive, the transistor $Q_3$ is conductive and so are the transistors $Q_9$ and $Q_7$. Thus, the charging current for the capacitor 8 flows through the diode-connected transistor $D_2$ and the transistors $Q_2$, $Q_7$, and $Q_5$. Conversely, when the transistor $Q_1$ is conductive and the transistor $Q_2$ is non-conductive, the transistors $Q_8$ and $Q_6$ are made conductive with the result that the charging current for the capacitor 8 flows through the diode-connected transistor $D_1$ and the transistors $Q_1$ and $Q_6$ and $Q_5$. The circuit alternates between these two states. While this is happening, the value of the charging current flowing through the transistor $Q_5$ is changed in response to the video signal so that, as may be apparent from the formula (2), modulated video signals with opposite polarities can be obtained at the emitter electrodes of the transistors $Q_3$ and $Q_4$ which are the output terminals of the frequency modulator 6.

FIG. 5 includes common by-pass current control means for supplying currents to the capacitor 8 other than the current flowing through the transistor $Q_5$. A series connection of a resistor 17, a potentiometer 19 and a resistor 18 is connected between the terminals $t_1$ and $t_2$ in parallel with the capacitor 8, and the movable arm of the potentiometer 19 is supplied with a predetermined voltage which is obtained by dividing the power supply voltage of $+V_{CC}$ by means of a series connection of a resistor 20, a potentiometer 22 and a resistor 21.

Assuming that the arm of the potentiometer 19 is positioned at the center of its fixed resistor, if the direct voltage at the arm of the variable resistor 22 is lower than the terminal voltage across the capacitor 8, the charging current flowing to the capacitor 8 will be separated in two paths to ground and thereby reduced. As a result, the charging current to the capacitor 8 will be reduced as compared to the charging current for the capacitor if the series connection of the resistors 17, 18, and the variable resistor 19 were not provided. This permits the oscillation frequency of the frequency modulator 6 to be reduced. If, on the contrary, the direct voltage at the arm of the potentiometer 22 is greater than the terminal voltage across the capacitor 8, the charging current to the capacitor 8 can be increased and hence the oscillation frequency of the frequency modulator 6 can be increased. A discharging current of the capacitor 8 flows through the series connection of the resistors 17,18 and the variable resistor 19 and also through the resistors to ground in the first case described above, but these discharging currents or lost power are made small by the resistors in comparison with the charging current which also flows through the transistor $Q_5$ and input current for correction in the second case.

Thus, the capacitor 8 is supplied with the inherent current by the transistor $Q_5$ and also with the correction current so that, by adjusting the direction and magnitude of the correction current with the potentiometer 22, the oscillation frequency of the frequency modulator 6, which corresponds to the tip level of sync clipping level of the horizontal synchronizing signal, is selected as the reference frequency $f_o$.

The potentiometer 19 serves to set the duty ratio of the output signal from the frequency modulator 6 at 50%. If the potentiometer 19 is adjusted, the values of the correction currents within the two time intervals in which the conductive and non-conductive states of the transistors $Q_1$ and $Q_2$ are reversed can be changed with each other. Accordingly, even if the characteristics of the transistors are unequal, the duty ratio of the output signal from the frequency modulator 6 can be made equal to 50%. Thus, carrier leakage that would cause deterioration in the quality of a reproduced picture if such leakage occurred during demodulation can be avoided.

Further, in the embodiment of FIG. 5, the modulated output signal from the frequency modulator 6 is delivered through a differential amplifier 23 to an output terminal 24. This is, one output signal produced at the emitter electrode of the transistor $Q_3$ in the frequency modulator 6 is applied through a transistor $Q_{10}$ connected as an emitter follower to the base electrode of a transistor $Q_{11}$, while the other output signal produced at the emitter electrode of the transistor $Q_4$ in the frequency modulator 6 is applied through a transistor $Q_{12}$ connected as an emitter follower to the base of a transistor $Q_{13}$. The emitter electrodes of the transistors $Q_{11}$ and $Q_{13}$ are connected together through resistors to a constant current source comprising a transistor $Q_{14}$. A load resistor is connected to the collector electrode of the transistor $Q_{11}$ to which the output terminal 24 is connected.

At the emitter electrode of the transistor $Q_3$ in the frequency modulator 6, there is produced an output signal when the transistor $Q_1$ is changed from being conductive to being non-conductive. The leading edge of this output signal is rounded off, as shown in FIG. 6A, by means of the diode $D_1$, the resistor 25 connected in parallel with the diode $D_1$, and stray capacitance. This rounded-off signal is supplied to the base electrodes of the transistors $Q_{10}$ and $Q_{11}$ of the differential amplifier 23. Conversely, at the emitter electrode of the transistor $Q_4$ in the frequency modulator 6, there is obtained a similar output signal with a rounded-off leading edge which is determined by the diode $D_2$, the resistor 26 connected in parallel to the diode $D_2$ and stray capacitance, as shown in FIG. 6B. This signal is supplied to the base electrodes of the other transistors $Q_{12}$ and $Q_{13}$. As a result, at the output terminal 24 there is obtained a modulated signal which is symmetrical as shown in FIG. 6C and, therefore, has no even harmonics. Thus, it may be understood that when such a modulated signal is demodulated, no carrier leakage occurs.

With the embodiment shown in FIG. 5, the duty ratio of the astable multivibrator circuit or frequency modulator 6 is adjusted to 50% by controlling the potentiometer 19. Accordingly, if several astable multivibrators are used, it is necessary to provide a potentiometer 19 for every astable multivibrator and to adjust, separately, the duty ratio of the signal generated by each multivibrator. This results in deterioration of working efficiency, and it increases the cost of the apparatus.

Figure 7:
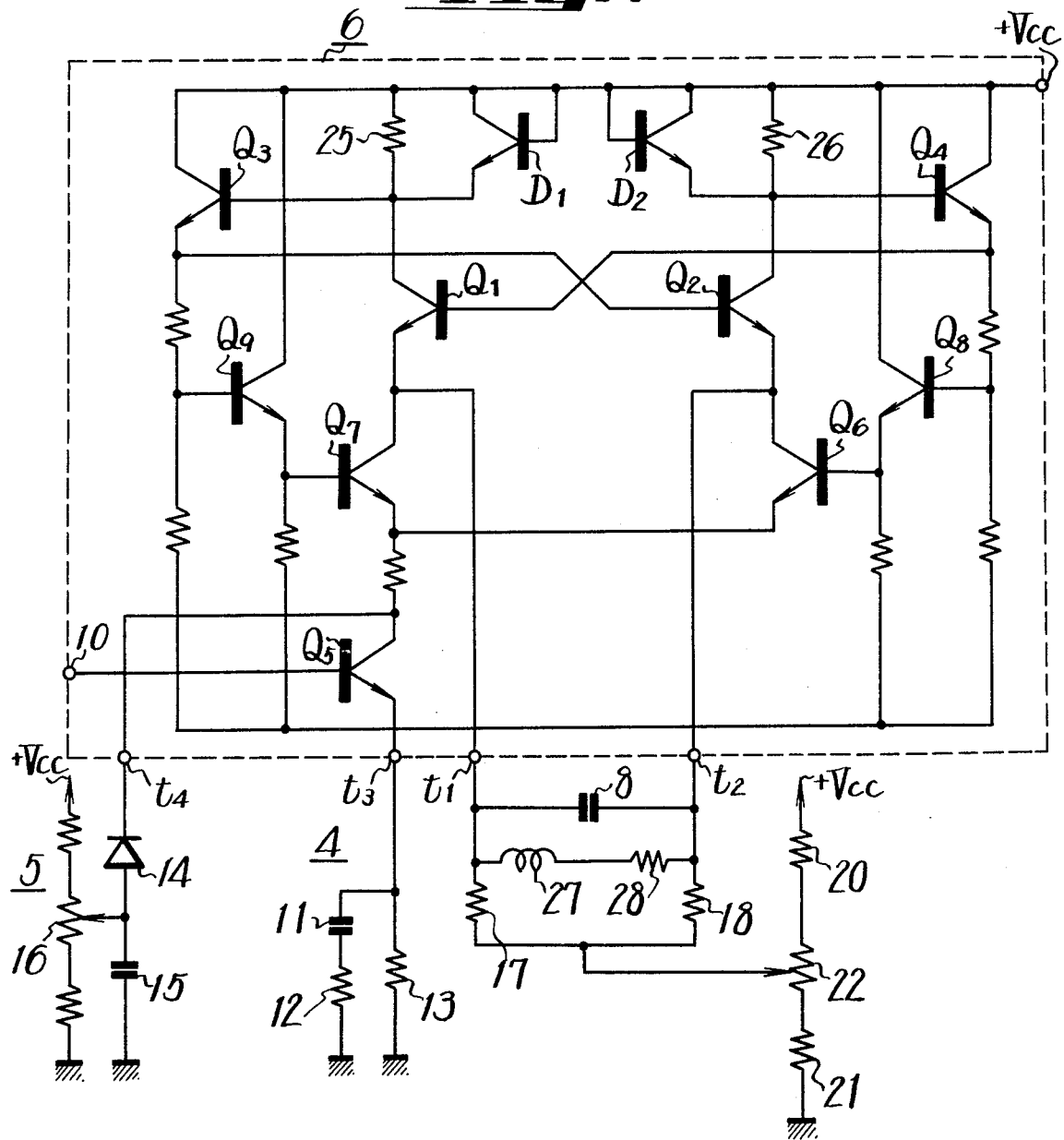
FIG. 7 is a schematic circuit diagram showing another embodiment of the invention.

In order to avoid such a defect, another embodiment of the invention is provided as shown in FIG. 7, in which the same reference numerals and symbols as those in FIGS. 3 and 5 indicate the same elements. A series connection of an element having inductive reactance, such as a coil 27, and a resistor 28 is connected in parallel to the capacitor 8. In this case, the coil 27 is so selected that it has sufficiently great impedance for the oscillation frequency. At the initiation of oscillation, if no charge is stored in the capacitor 8, the oscillation is not started. When the oscillation is not started, the impedance of the coil 27 is zero and hence the capacitor 8 is short-circuited, thus discharging completely any charge stored in the capacitor 8. To avoid such a discharge of the capacitor 8, the resistor 28 is used to suppress the discharging current of the capacitor 8.

With a circuit constructed as shown in FIG. 7, it is ascertained that the duty ratio of the output pulse can be made 50% and the second high harmonics contained in the output pulse can be easily reduced, and in this case there is no need to adjust the coil 27 and the resistor 28.

FIG. 8 is a graph showing one of the measured results of the invention. That is, under the condition that the currents $I_0$ from the constant current sources 9A and 9B in FIG. 3 are changed in the same polarity to vary the oscillation frequency of the frequency modulator, the relationship between the oscillation frequency and the second high harmonics is measured and shown in the graph of FIG. 8. In the graph of FIG. 8, a curve 29 shows the case of the embodiment shown in FIG. 3, a curve 30 in the case of the embodiment shown in FIG. 5 and a curve 31 in the case of the embodiment shown in FIG. 7, respectively. In the graph of FIG. 8, $\Delta f_0$ represents a range of the frequency deviation when the astable multivibrator of the invention is employed as the frequency modulator circuit of the VTR. In this case, the values of the capacitor 8, the coil 27 and the resistor 28 are selected as 120 pF, 1 to 10 mH and 510Ω, respectively.

As may be obvious from FIG. 8, with the embodiment of FIG. 7, the second high harmonics can be reduced in level by such an extent that the level of the second high harmonics is reduced by the potentiometer 19 in the embodiment of FIG. 5 (refer to the curves 31 and 30). In other words, it is possible for the duty ratio of the output pulse to be made 50% exactly. In addition it is not necessary to adjust the values of the coil 27 and the resistor 28 of every circuit.

The above description of the invention is given for the use of the multivibrator as a frequency modulator circuit, but it may be understood that the multivibrator circuit of the present invention can also be used as a frequency demodulator. It is also possible to use the multivibrator circuit of the present invention for the phase modulation instead of the frequency modulation. Further, the present invention is not necessarily limited to use as part of a VTR but may be incorporated in other electronic instruments.

What we claim is:

1. A circuit comprising a frequency controllable multivibrator comprising:
   A. first and second transistors each including a base electrode, an emitter electrode and a collector electrode, said collector electrodes of said first and second transistors being coupled to said base electrodes of said second and first transistors, respectively;
   B. voltage supply means for supplying a voltage;
   C. first and second load elements connecting respective ones of said collector electrodes of said first and second transistors to said voltage supply means;
   D. a capacitor connected between said emitter electrodes of said first and second transistors for enabling conduction of the latter alternately;
   E. a pair of current controlling devices each including input, output and common electrodes, said input and output electrodes of each of said pair of current controlling devices being connected respectively to said collector and emitter electrodes of a respective one of said first and second transistors for controlling said devices with output signals of said first and second transistors;
   F. a common main current source comnecting said common electrodes of said pair of current controlling devices to said voltage supply means and through which a relatively large main current is fed from said pair of current controlling devices alternately; and
   G. a common by-pass current control means connected to each side of said capacitor and through at least a portion of which a relatively small controllable portion of said relatively large current to be supplied to said common main current source is fed for minimizing lost power, said common by-pass current control means also controlling another current to said capacitor for determining an oscillation characteristic of said multivibrator circuit.

2. A circuit according to claim 1; in which said main current source includes a constant current source element common to said pair of current controlling devices and having an input terminal, a common terminal connected in common to said pair of current controlling devices, and an output terminal.

3. A circuit according to claim 2; in which said input terminal controls said constant current source element, whereby said constant current can be modulated with a signal to said input terminal.

4. A circuit according to claim 3; in which said element is constituted by a transistor having base, emitter and collector electrodes forming said input, output and common terminals.

5. A circuit according to claim 3; further comprising means applying a modulating signal to said input terminal for varying the current through said element so that the frequency of said multivibrator is modulated.

6. A circuit according to claim 5; further comprising a video recording clamping circuit; and in which said input terminal of said controllable device is connected to said clamping circuit, and said modulating signal is a video signal.

7. A circuit according to claim 5; further comprising a video recording white level clipping circuit; and in which said modulating signal is a video signal, and said output terminal of said controllable device is connected to said white level clipping circuit.

8. A circuit according to claim 5; further comprising a video recording pre-emphasis circuit; and in which said modulating signal is a video signal, and the common terminal of said controllable device is connected to said pre-emphasis circuit.

9. A circuit according to claim 1; in which said by-pass current control means includes a first variable resistor means for determining the duty ratio of said multivibrator circuit.

10. A circuit according to claim 9; in which said first variable resistor means comprises a potentiometer having a resistive element and an arm movable along the latter, and means for applying a voltage to said arm.

11. A circuit according to claim 10; in which said by-pass current control means further includes a second variable resistor for controlling the voltage applied to said arm of said potentiometer for determining the frequency of said multivibrator circuit.

12. A circuit according to claim 1; in which said by-pass current control means includes a variable resistor means for determining the frequency of said multivibrator circuit.

13. A circuit according to claim 12; in which said by-pass current control means further includes an inductance coupled across said capacitor by which the duty ratio of said multivibrator circuit is controlled.

14. A circuit according to claim 13; in which said by-pass current control means further includes a resistor forming a series circuit with said inductance, and said series circuit is in parallel with said capacitor.

* * * * *